(12) United States Patent  (10) Patent No.: US 7,648,891 B2
Farooq et al.  (45) Date of Patent: Jan. 19, 2010

(54) SEMICONDUCTOR CHIP SHAPE ALTERATION

(75) Inventors: Mukta G. Farooq, Hopewell Junction, NY (US); Dae-Young Jung, LaGrangeville, NY (US); Ian D. Melville, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 11/615,236

(22) Filed: Dec. 22, 2006

(65) Prior Publication Data

US 2008/0150087 A1   Jun. 26, 2008

(51) Int. Cl.
    *H01L 21/78* (2006.01)
(52) U.S. Cl. .................. 438/462; 257/E21.602
(58) Field of Classification Search ........... 438/463
    See application file for complete search history.

(56) References Cited

U.S. PATENT DOCUMENTS 6,093,943 A    7/2000  Ikemasu et al.
6,399,178 B1   6/2002  Chung
6,638,691 B2   10/2003 Kang et al.
6,869,861 B1   3/2005  Glenn et al.
6,878,609 B2   4/2005  Wanibe et al.
6,915,795 B2   7/2005  Brouillette et al.
2005/0196899 A1* 9/2005 Shimizu et al. ............. 438/113

FOREIGN PATENT DOCUMENTS

JP   02-179708    7/1990
JP   03-236258    10/1991
JP   04-116848    4/1992
JP   08-293476    11/1996
JP   2005-252178  9/2005

* cited by examiner

*Primary Examiner*—Stephen W Smoot
(74) *Attorney, Agent, or Firm*—Lisa U. Jaklitsch; Katherine S. Brown

(57) ABSTRACT

The invention is directed to an improved semiconductor chip that reduces crack initiation and propagation into the active area of a semiconductor chip. A semiconductor wafer includes dicing channels that separate semiconductor chips and holes through a portion of a semiconductor chip, which are located at the intersection of the dicing channels. Once diced from the semiconductor wafer, semiconductor chips are created without ninety degree angle corners.

6 Claims, 6 Drawing Sheets

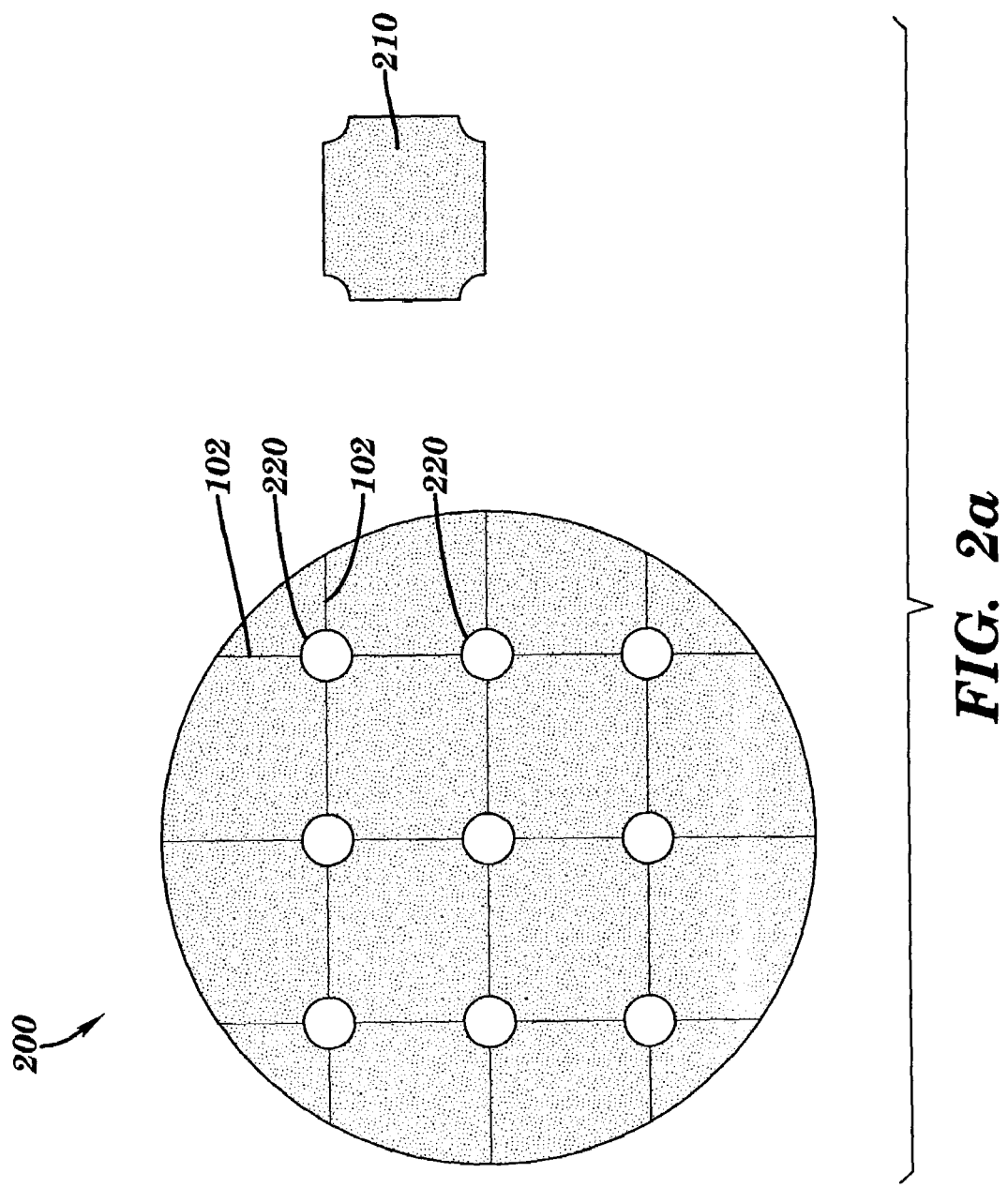

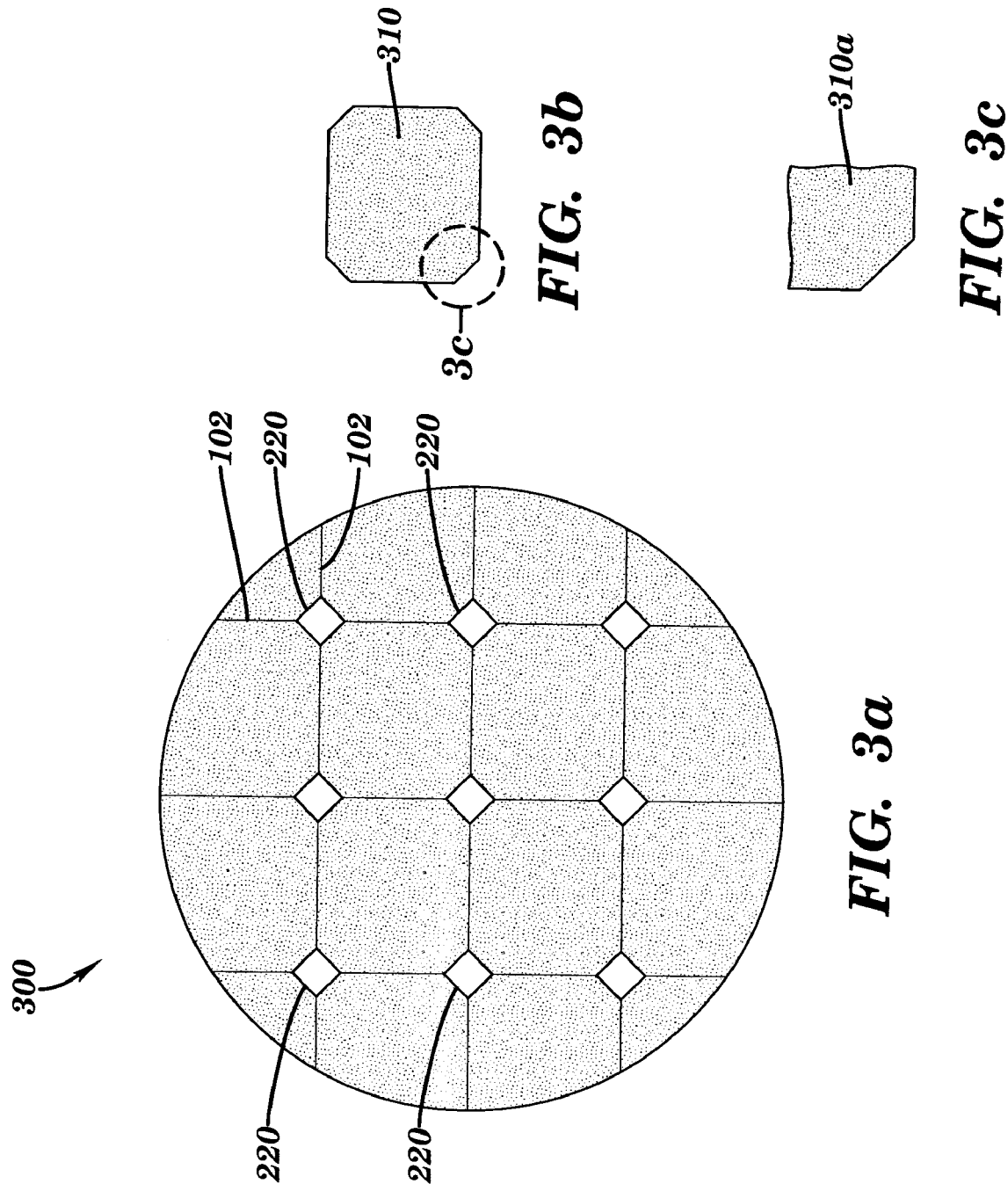

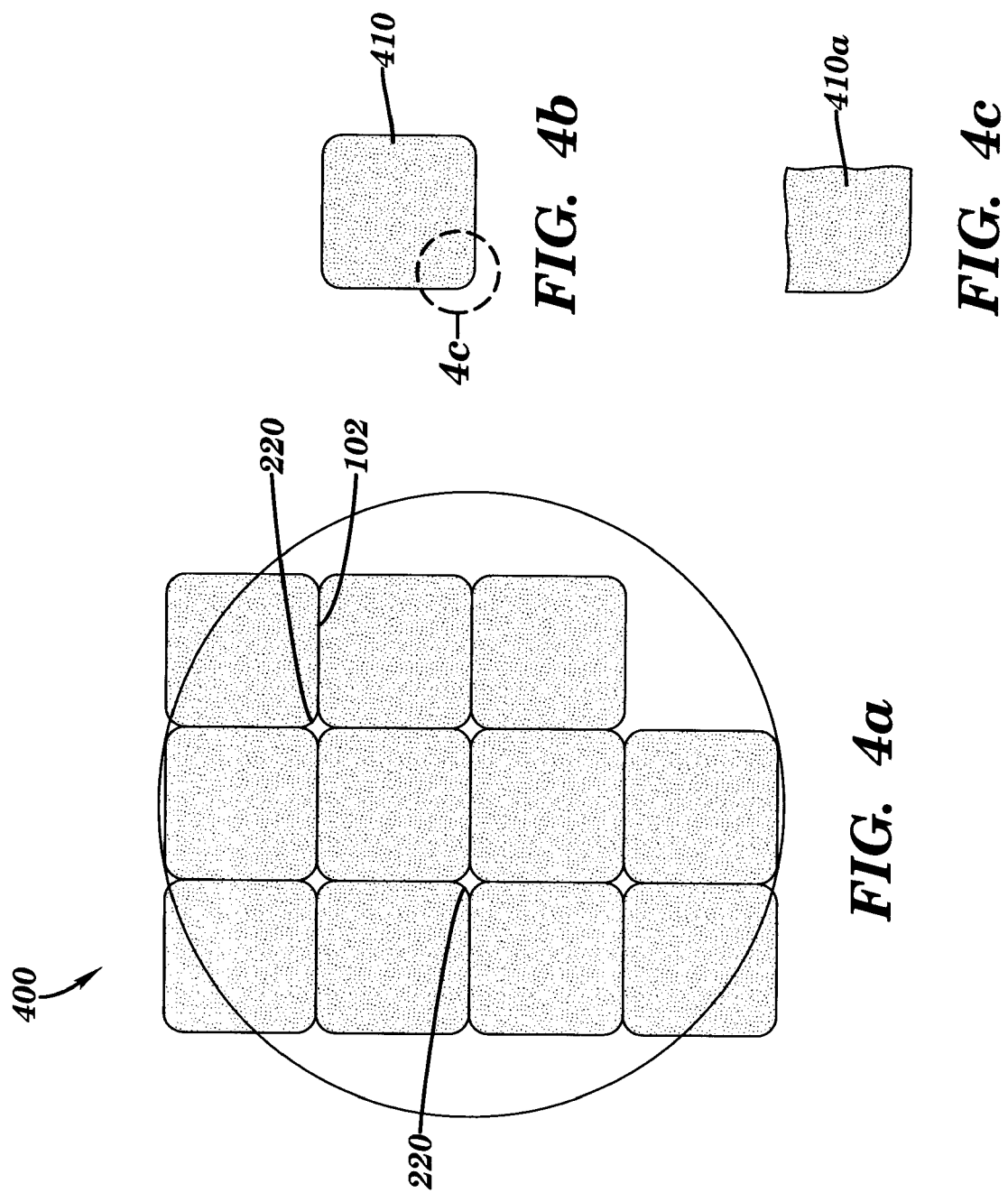

SEMICONDUCTOR CHIP SHAPE ALTERATION

BACKGROUND OF THE INVENTION

1. Field of the Invention

The invention relates generally to semiconductor devices, and more particularly to a semiconductor chip shape alteration.

2. Description of the Related Art

The shape of a semiconductor chip is important to semiconductor technology. The shape of a semiconductor chip can cause physical stress on the semiconductor chip. Stress on the semiconductor chip causes delamination, which is the fracture of a semiconductor chip's Back End of the Line ("BEOL") materials, which in turn leads to semiconductor chip failure. Prior art semiconductor chips are limited to square and rectangular shapes, which introduce the most stress on the semiconductor chip, because of the ninety degree corners inherent in such shapes.

FIGS. 1a-1b depict a prior art semiconductor wafer 100 and chip 110. Note the perpendicular dicing channels 102 in the prior art semiconductor wafer 100. Once diced, singulated die, also known as semiconductor chips, are separated from the semiconductor wafer 100. Once separated, the semiconductor chips 110 have a square or rectangular shape. FIG. 1b highlights the problem associated with prior art semiconductor chips 110. More specifically, a semiconductor chip 110 diced from the prior art semiconductor wafer 100 results in a square or rectangular semiconductor chip 110.

Prior art square and rectangular semiconductor chip 110 shapes introduce stress on the semiconductor chip 110, and particularly at the corners 108. Such stress causes delamination, which is a problem in prior art semiconductor chips 110. Often delamination begins in the triangular zone 106 and travels toward the active area 112 of the semiconductor chip 110. Once delamination reaches the active area 112, the semiconductor chip 110 fails. While prior art semiconductor chips 110 include a crackstop, which functions to prevent delamination into the active area 112, crackstops 112 are largely ineffective as semiconductor technology evolves because low-k dielectric is more frequently used. Low k dielectric material is particularly susceptible to delamination.

What is needed in the art is an improved semiconductor chip shape that reduces delamination.

BRIEF SUMMARY OF THE INVENTION

The invention is directed to a method for creating a semiconductor chip. The method comprises a creating and dicing step. The creating step comprises creating a hole in a semiconductor wafer comprising semiconductor chips separated by dicing channels. The hole is created at an intersection of the dicing channels. The dicing step comprises dicing through the dicing channels and a portion of the semiconductor chip at the intersection of the dicing channels.

The invention solves the problem of delamination by creation of a semiconductor chip without any ninety degree corners. The absence of ninety degree corners reduces physical stress on the semiconductor chip, which in turn mitigates against delamination.

Prior art methods for semiconductor chip creation focus on dicing efficiency and manufacturing cost minimization. Prior art methods specify neither the alteration of semiconductor chip shape nor the influence of chip shape on stress to the semiconductor chip. Even were prior art methods to focus on alteration of semiconductor chip shape, which prior art methods have not, prior art methods would not focus on the increased propensity of certain semiconductors materials to cause delamination within the semiconductor chips. More specifically, as semiconductor technology evolves, low k dielectric materials are more frequently utilized, which are prone to delamination.

The invention solves the aforementioned problems associated with prior art semiconductor chips.

For at least the foregoing reasons, the invention improves semiconductor technology.

BRIEF DESCRIPTION OR THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference, to the detailed description which follows, taken in conjunction with the accompanying figures, in which:

FIG. 1b depicts a prior art semiconductor chip diced from the semiconductor wafer 100 of FIG. 1a;

FIG. 2a depicts a semiconductor wafer 200 of a first embodiment of the invention;

FIG. 2b depicts a semiconductor chip 210 diced from the semiconductor wafer 200 of FIG. 2a;

FIG. 3 depicts a semiconductor wafer 300 of a second embodiment of the invention; and, FIG. 4 depicts a semiconductor wafer 400 of a third embodiment of the invention.

DETAILED DESCRIPTION OF THE INVENTION

Figure 1A:
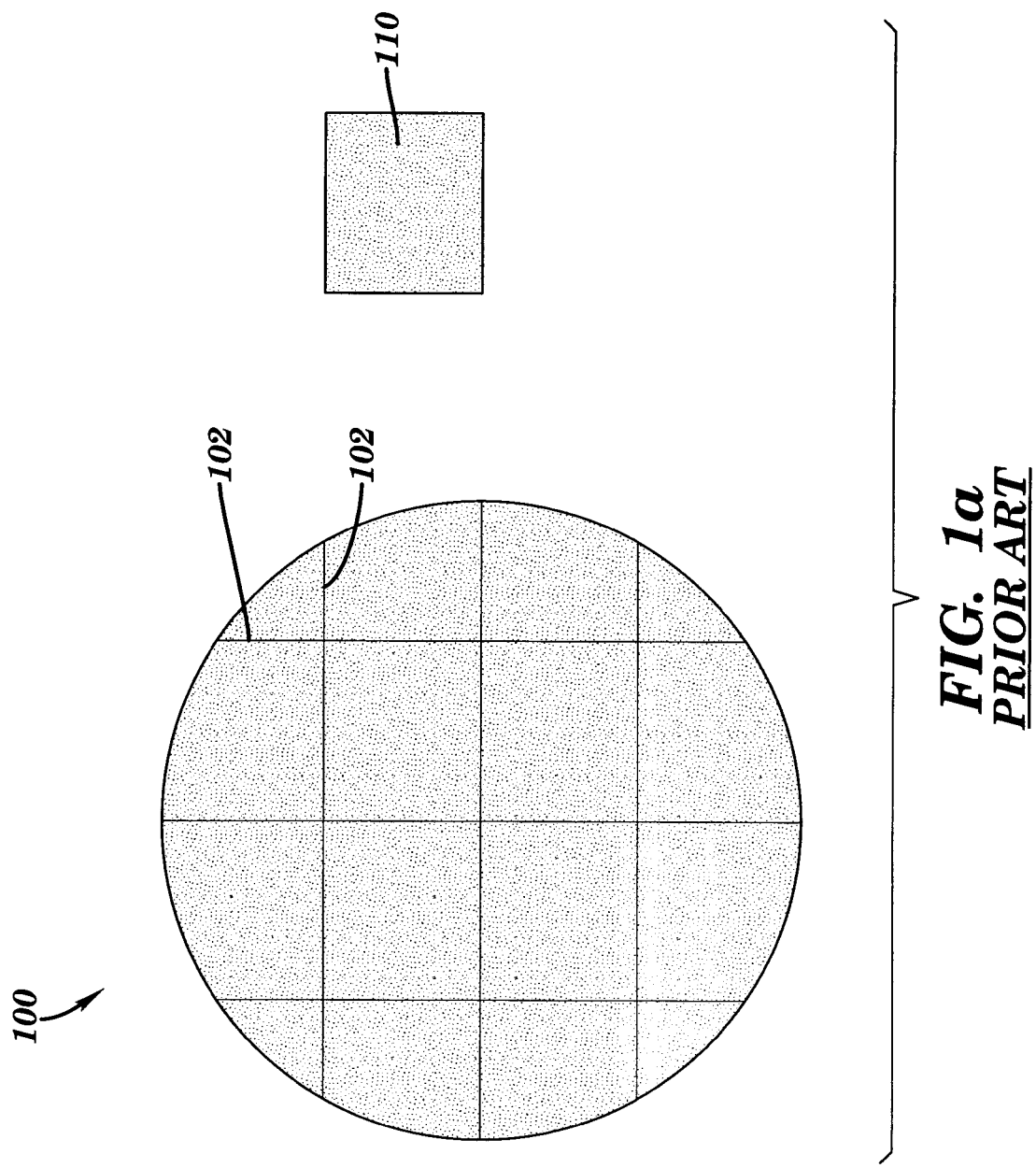
FIG. 1a depicts a prior art semiconductor wafer 100.

The invention, will now be described with reference to the accompanying figures. In the figures, various aspects of the structures have been depicted and schematically represented in a simplified manner to more clearly describe and illustrate the invention.

By way of overview and introduction, the invention is directed to a method for creating a semiconductor chip absent any ninety degree angles. The semiconductor chip originates from a semiconductor wafer with dicing channels that separate semiconductor chips and holes at each intersection of the dicing channels. Once diced, semiconductor chips are created without any ninety degree angles.

An embodiment of the invention 200 will be described with reference to the FIG. 2a. As shown the semiconductor wafer 200 includes holes 220 at the intersection of the dicing channels 102. The holes 220 can be created by laser drilling, Bosch process deep drilling, photolithography followed by reactive ion etching, or ion milling. Once the semiconductor wafer 200 is diced, semiconductor chips 210 as shown in FIG. 2a are created. The semiconductor wafer 200 can be diced by mechanical saw blade dicing or laser dicing.

Figure 2B:
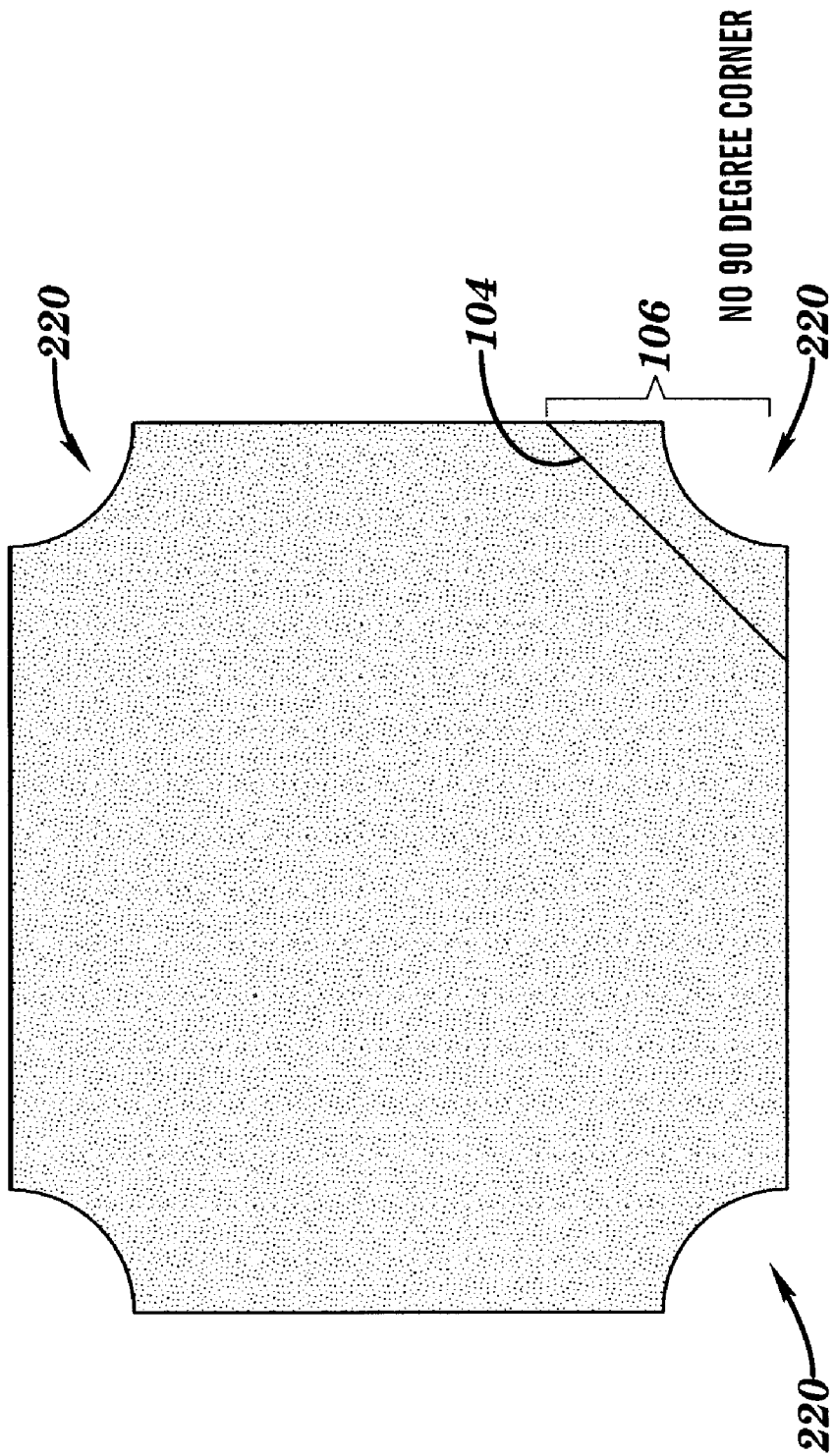

FIG. 2b further depicts the semiconductor chip 210 diced from the semiconductor wafer 200 of FIG. 2a. As shown, the semiconductor chip 210 does not have a corner with a ninety degree angle 220. Therefore, the semiconductor chip 210 has a reduced underfill to hard passivation layer (triangular zone 106). Note that the triangular zone 106 is substantially reduced in the embodiment, while maintaining the crackstop 104. The substantially reduced triangular zone 106 reduces the initiation, and therefore the propagation of cracks in the semiconductor chip 210. While FIG. 2*a*, depicts holes 220 with a circle shape, FIGS. 3-4 depict holes 220 of another shape.

FIG. 3 depicts a semiconductor wafer 300 of a further embodiment of the invention. More specifically, FIG. 3 depicts holes 220 with a diamond shape. Similar to the holes 220 with a circle shape shown in FIG. 2*a*, the holes 220 with a diamond shape in FIG. 3, substantially reduces the triangular zone 106 (not shown), which in turn reduces the initiation and propagation of cracks in the semiconductor chip 210. Note that the semiconductor chip 310 in FIG. 3, similar to the semiconductor chip in FIG. 2*b*, has the advantage of corners without ninety degree corners. Note the exploded view 310*a* of a corner of the semiconductor chip shown in FIG. 3. As shown in the exploded view 310*a*, the corner of the semiconductor chip does not have a ninety degree corner.

FIG. 4 depicts a semiconductor wafer 400 of a third embodiment of the invention. Similar to the semiconductor chips in FIGS. 2*b* and 3, the semiconductor chip 410 in FIG. 4 does not have a ninety degree corner. The corner in the semiconductor chip 410 of FIG. 4 has a concave shape. As shown in the exploded view 410*a* of the semiconductor chip 410 the corner has a concave shape, which necessarily requires that the corner does not have a ninety degree corner. Similar to FIGS. 1-3, the semiconductor wafer 400 has dicing channels 102. Further, similar to FIGS. 2*a* and 3, the semiconductor wafer 400 has holes 220. The shape of the holes 220 in the semiconductor wafer 400 of FIG. 4 creates a corner in the semiconductor chip 410 with a concave shape.

Figure 1B:
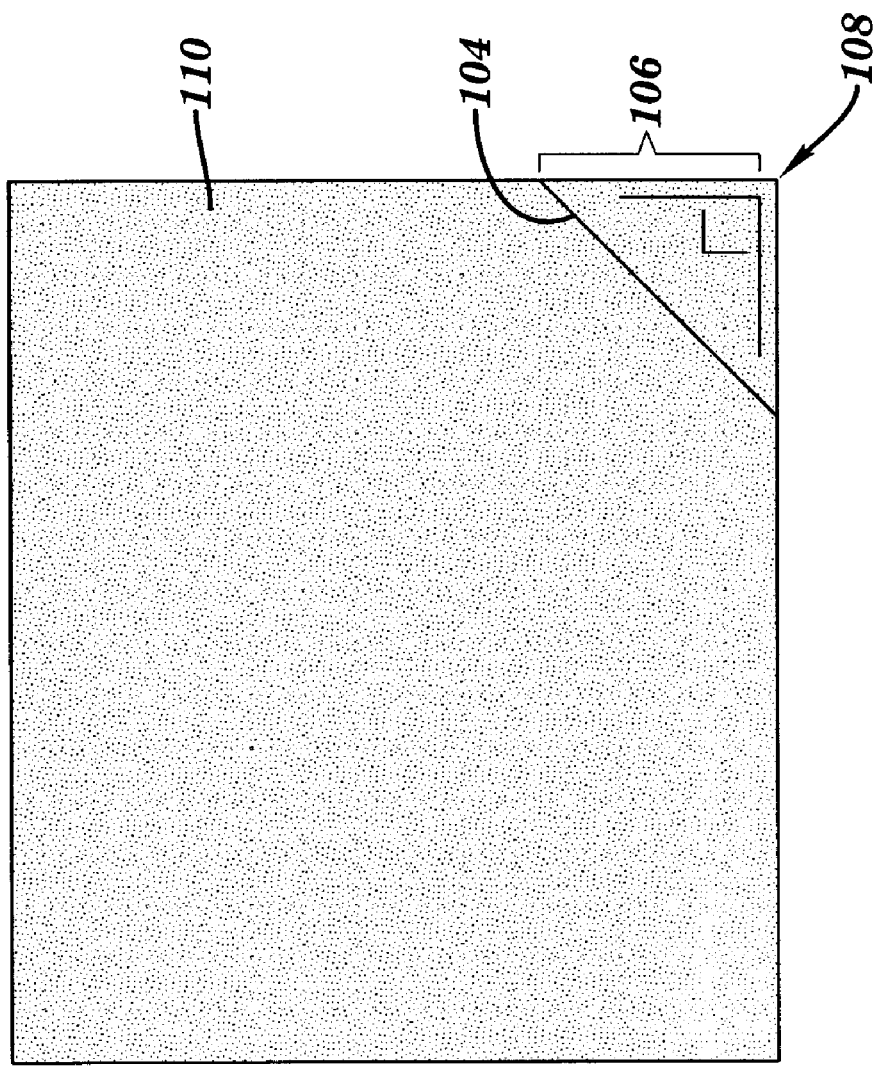

Unlike the prior art depicted in FIGS. 1*a-b*, the embodiments depicted in FIGS. 2*a*-4 reduce delamination initiation and propagation by eliminating semiconductor chips with corners having ninety degree angles.

The invention solves the aforementioned problems associated with prior art semiconductor chips. More specifically, the invention eliminates any corner with a ninety degree angle in a semiconductor chip.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A method for creating a semiconductor chip, comprising:
   creating a hole in a semiconductor wafer comprising a plurality of rectilinear semiconductor chips separated by dicing channels, such that the hole is created at an intersection of the dicing channels and through a portion of an adjacent semiconductor chip eliminating a substantially ninety degree corner thereof; and,
   dicing through the dicing channels at the intersection of the dicing channels.

2. A method as in claim 1, the creating step comprising at least one of laser drilling, Bosch process deep drilling, photolithography followed by reactive ion etching, and ion milling.

3. A method as in claim 1, the dicing step comprising at least one of mechanical saw blade dicing and laser dicing.

4. A method as in claim 1, shape of the hole comprising one of a circle, diamond, octagon, and concave shape.

5. A method as in claim 1, the dicing step resulting in a semiconductor chip with an absence of substantially ninety degree corners.

6. A method as in claim 1, the dicing step resulting in a plurality of semiconductor chips with a reduced underfill to hard passivation contact area.

\* \* \* \* \*